US006864435B2

(12) United States Patent
Hermanns et al.

(10) Patent No.: US 6,864,435 B2
(45) Date of Patent: Mar. 8, 2005

(54) ELECTRICAL CONTACTS FOR FLEXIBLE DISPLAYS

(75) Inventors: Anno Hermanns, San Jose, CA (US); Randolph W. Eisenhardt, Prunedale, CA (US); Glenn W. Gengel, Hollister, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 123 days.

(21) Appl. No.: 10/131,517

(22) Filed: Apr. 23, 2002

(65) Prior Publication Data

US 2003/0155151 A1 Aug. 21, 2003

Related U.S. Application Data

(60) Provisional application No. 60/286,838, filed on Apr. 25, 2001.

(51) Int. Cl.[7] .............................. H01R 12/04; H05K 1/11
(52) U.S. Cl. ........................................ 174/262; 174/264
(58) Field of Search ................................. 174/254–258, 174/260–264; 361/736–737; 257/679, 693; 235/492; 349/149–150

(56) References Cited

U.S. PATENT DOCUMENTS

| 5,111,278 | A | * | 5/1992 | Eichelberger | ................ 257/698 |
| 5,545,291 | A | | 8/1996 | Smith et al. | |
| 5,996,897 | A | * | 12/1999 | Prancz | ........................ 235/492 |
| 6,642,611 | B2 | * | 11/2003 | Iwasaki | ....................... 257/679 |
| 6,693,384 | B1 | | 2/2004 | Vicentini et al. | |
| 2002/0000037 | A1 | | 1/2002 | Chou et al. | |

FOREIGN PATENT DOCUMENTS

| WO | WO 01/26180 A1 | 4/2001 |
| WO | WO 02/067329 A1 | 8/2002 |

OTHER PUBLICATIONS

PCT International Search Report for International Application No. PCT/US 03/12540 dated Mar. 30, 2004.

* cited by examiner

*Primary Examiner*—Kamand Cuneo
*Assistant Examiner*—Tuan Dinh
(74) *Attorney, Agent, or Firm*—Blakely, Sokoloff, Taylor & Zafman LLP

(57) ABSTRACT

A flexible electronic, Radio Frequency Identification (RF ID) or display device and methods of making the same. The flexible electronic, Radio Frequency Identification (RF ID) or display device comprises a flexible substrate having a top surface and a bottom surface. The top surface comprises electrical components. The flexible substrate comprises openings cutting therethrough from the top surface to the bottom surface. A conductive layer is coupled to the flexible substrate wherein the openings expose at least a portion of the conductive layer. The openings are filled with conductive elements to make first electrical contacts to at least a portion of the conductive layer and second electrical contacts to the electrical components on the flexible substrate.

8 Claims, 5 Drawing Sheets

FLEXIBLE DISPLAY BACKSIDE CONTACTS PATTERNED WITH LASER HOLE DRILLING FOR DISPLAY
INTEGRATION INTO SMART CARDS AND SIMILAR DEVICES

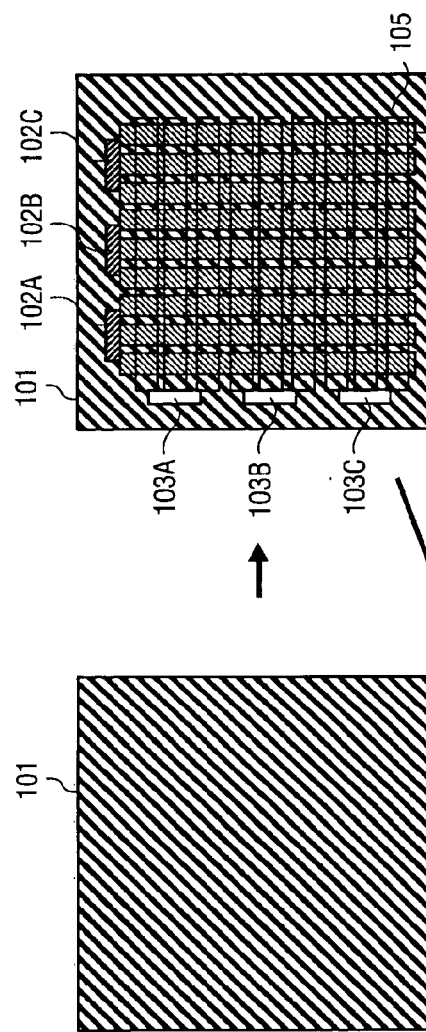
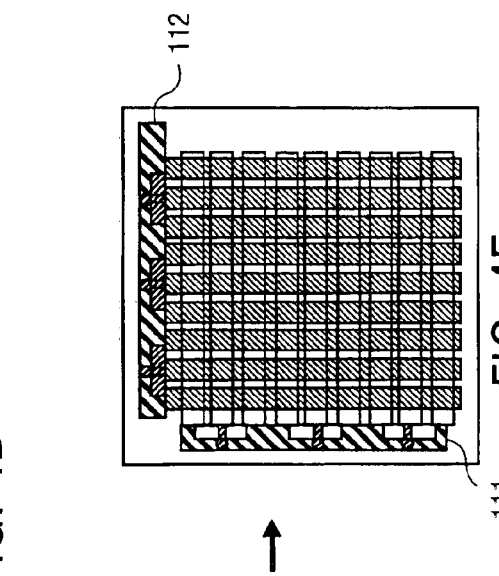
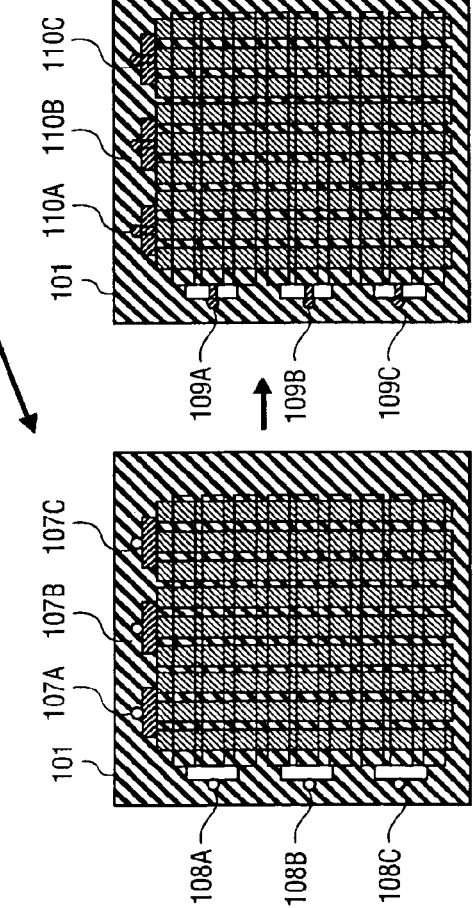
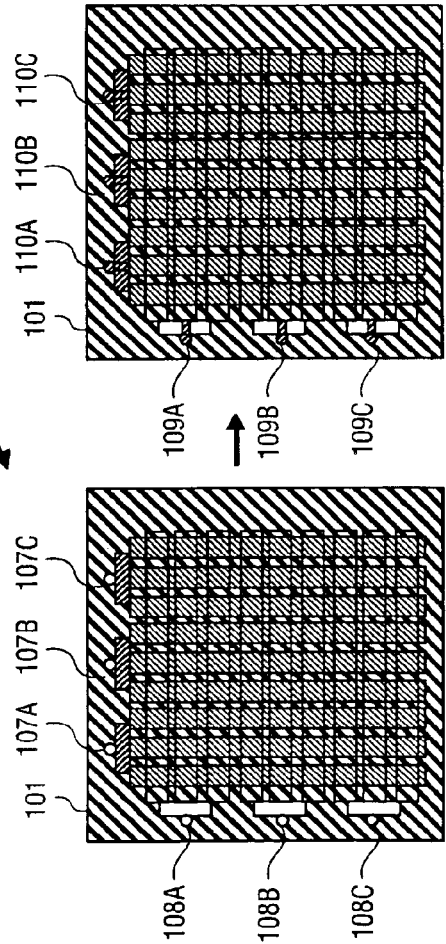
FIG. 4A  FIG. 4B  FIG. 4C  FIG. 4D  FIG. 4E

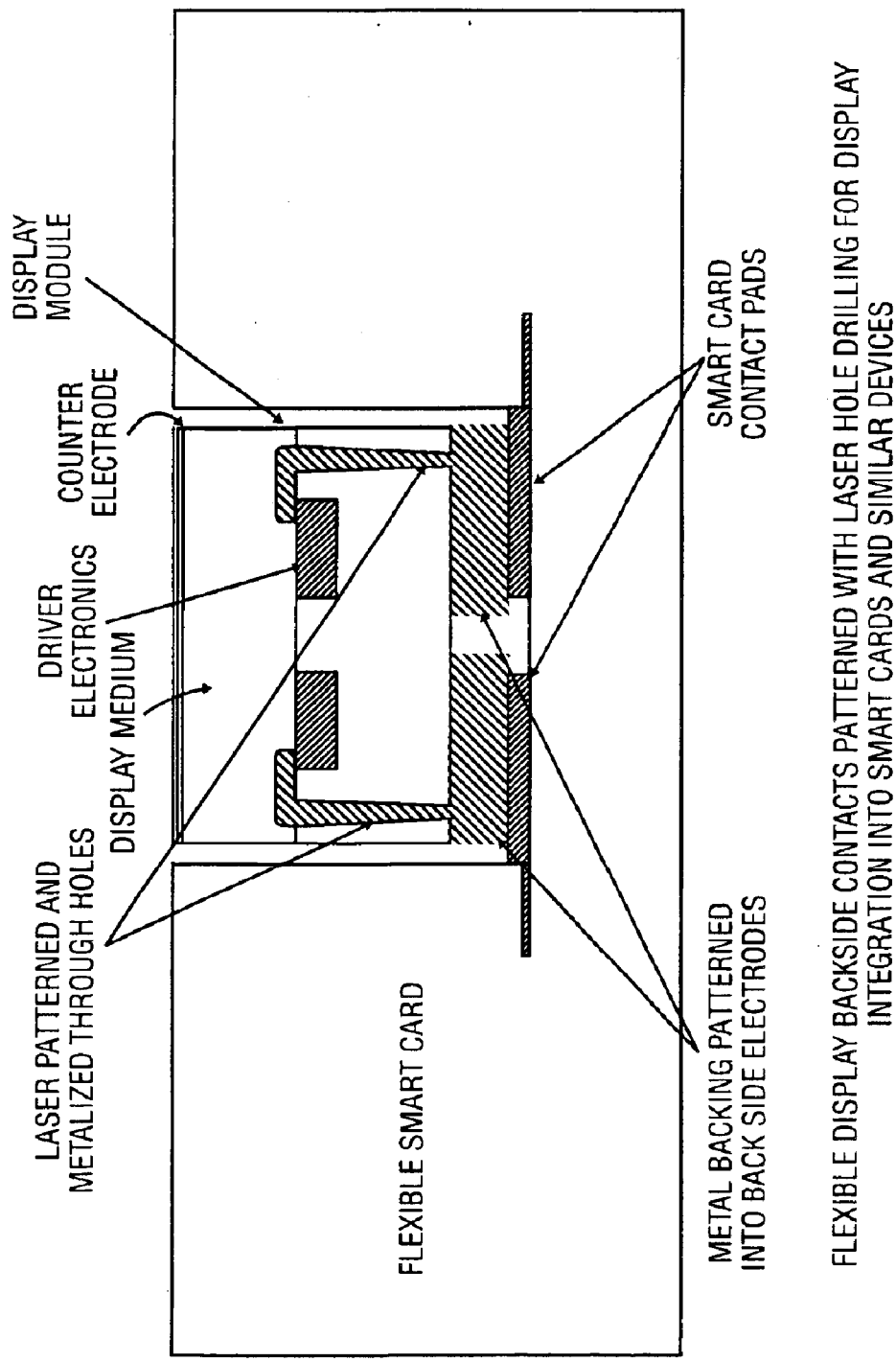

ELECTRICAL CONTACTS FOR FLEXIBLE DISPLAYS

RELATED APPLICATION

This application is based on U.S. Provisional patent application No. 60/286,838 filed on Apr. 25, 2001 entitled "Contacts For Flexible Displays." This application claims priority of the provisional application so mentioned.

BACKGROUND

The fabrication of flexible displays, particularly flexible displays which are fabricated through a process which includes fluidic self-assembly, has relied upon the creation of electrical interconnections on a single side of the display device. Examples of such flexible display devices are shown in co-pending U.S. patent application Ser. No. 09/671,659, which was filed Sep. 27, 2000.

SUMMARY

The present invention pertains to methods and apparatuses for forming electrical contacts for flexible displays and for radio frequency (RF) tags. In one exemplary embodiment of the invention, a method for fabricating a flexible display device includes forming openings in a top surface of a flexible substrate which forms a part of a flexible display device, where the flexible substrate has a bottom surface which includes a conductive layer, and the openings expose at least a portion of the conductive layer. This method further includes filling the openings with a conductive material which makes electrical contact to at least a portion of the conductive layer, where the conductive material is also for making electrical contact to electrical display components on the top surface.

In another exemplary embodiment, a method for fabricating a flexible display device includes forming openings in a top surface of a flexible substrate which forms a part of a flexible display device, where the flexible substrate has a plurality of conductors disposed below the top surface, and the openings expose at least a portion of the plurality of conductors. The method further includes filling the openings with a conductive material which makes electrical contact to at least a portion of the plurality of conductors, where the conductive material also is for making electrical contact to electrical display components on the top surface.

The methods of the present invention may also be utilized in fabricating a radio frequency (RF) tag to produce radio frequency tags or portions thereof which have double-sided contacts on a substrate.

BRIEF DESCRIPTION OF THE DRAWINGS

The present invention is illustrated by way of example and not limitation in the figures of the accompanying drawings in which like references indicate similar elements.

FIGS. 4A, 4B, 4C, 4D, and 4E illustrate a particular fabrication process for constructing a passive matrix display on a flexible substrate to produce a flexible display according to one embodiment of the invention.

FIG. 5 illustrates a cross-sectional view of a flexible smart card, such as a credit card which includes integrated circuits and a display device, as in a display module, all on the same credit card substrate.

DETAILED DESCRIPTION

Figure 1:
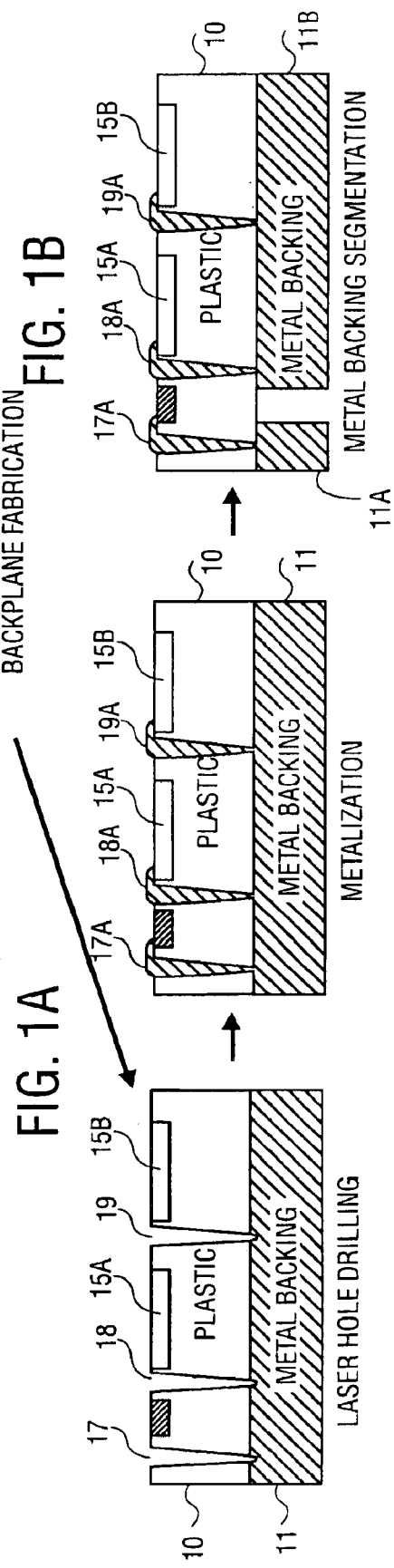
FIGS. 1A, 1B, 1C, 1D, and 1E show cross-sectional views of a substrate during a fabrication process for creating a flexible display or a radio frequency tag.

In the following description, numerous specific details such as specific materials, processing parameters, processing steps, etc., are set forth in order to provide a thorough understanding of the invention. One skilled in the art will recognize that these details need not be specifically adhered in order to practice the claimed invention. In other instances, well known processing steps, materials, etc., are not set forth in order not to obscure the invention The present invention pertains to methods for forming backside electrical contacts in flexible displays or RF tags using, in one embodiment, laser drilling. The present invention also pertains to apparatuses such as flexible displays or RF tags having backside electrical contacts. In the process of manufacturing a flexible display, such as a plastic display, a metal backing can be used to improve dimensional stability of the plastic substrate throughout the display manufacturing process. In one example, an adhesive layer is used to bond the metal backing to the plastic substrate. Dimensional stability is useful when the display manufacturing processes uses a roll to roll web process (which is similar to the manner in which paper is often fabricated). This metal backing has in the past not been segmented in order to provide electrical contacts. In the present invention, this metal backing or other conductive backing is segmented into one or more electrodes.

In one embodiment of the present invention, laser drilling is used to form through holes with sloped side walls into the plastic display substrate and/or to remove the adhesive layer bonding the metal backing to the plastic display substrate in cases where the through holes themselves are patterned into the plastic in a different manner. A preferred embodiment uses laser drilling to both form the through holes as well as to remove the adhesive layer which bonds the metal backing to the plastic display substrate or an RF device.

The use of laser drilling can form through holes with high accuracy and at a high rate with highly reproducible hole size and side wall slope which depends on the substrate, the laser wavelengths, and the laser pulse energy. The through hole connections can be completed in numerous ways, including, but not limited to, metal evaporation, metal sputtering, electroplating or electro-less plating, screen printing of conductive epoxy, conducting polymers, etc.

The present invention may be used with a variety of display technologies and display media, including liquid crystals, organic light emitting diodes (OLED), and a polymer light emitting diode (PLED). In one embodiment, the metal backing can be used as electrodes in up emitting active matrix OLED displays, as well as in up emitting or down emitting passive matrix displays to route large currents consumed by such a display. The metal backing, which is typically tens of microns thick, provides, in one embodiment, dimensional stability during the display manufacturing process (effectively providing a structural support to a substrate which is being exposed to various processes (in a roll to roll web process) and would subsequently be patterned into one or more discrete electrodes. In one embodiment, the metal backing is at least 10% of the entire thickness of the structure which includes the metal backing. Such thick metal electrodes allow the routing of large currents with negligible voltage drop. Laser hole drilling followed by a suitable via completion technique, such as metal sputtering or electroplating to facilitate rapid formation of highly reproducible, short, low resistance, well-aligned connections to driver electronics in their immediate proximity.

One application of the present invention is in the fabrication of smart cards and similar devices where separately manufactured displays may need to be integrated into the card. Ruggedness provided by the metal backing can be maintained, largely, while at the same time using the metal backing to provide multiple electrodes.

FIGS. 1A, 1B, 1C, 1D, and 1E show cross-sectional views of an apparatus having a flexible substrate and backside electrical contacts which can be used for a flexible display. The substrate of FIG. 1A includes a flexible substrate 10 and a conductive layer 11. In one example, the flexible substrate 10 is a plastic layer and the conductive layer 11 is a metal backing of a display. The conductive layer 11 is coupled to the flexible substrate 10. The metal backing is typically applied to the plastic layer using an adhesive (not shown). There are many commercially available plastic substrates which already include a metal backing which has been attached to the plastic substrate. In an alternative embodiment, a flexible substrate 10 may be attached to a polymer conductive material which provides electrical conductivity, while the plastic is an insulator. In this embodiment, the polymer conductive material may also provide dimensional stability.

FIG. 1B shows that electrical components, such as display drivers or other electrical components (e.g. integrated circuits in the form of shaped blocks have been deposited into regions or receptors created in the flexible substrate 10, such as the integrated circuits described in co-pending U.S. patent application Ser. No. 09/671,659, filed Sep. 27, 2000). The electrical components can be (a) row electrodes for a display, (b) column electrodes for a display, (c) integrated circuits for a display or a radio frequency tag, (d) supply electrodes for display drivers, and (e) other electrical components for a display, radio frequency tag, or any other suitable electronic device. These integrated circuits may be deposited into the flexible substrate 10 through a fluidic self-assembly process or other processes. The flexible substrate 10 has a top surface 10T and a bottom surface 10B. In one example, the electrical components are incorporated near the top surface 10T. In another example, the electrical components are incorporated just immediately below the top surface 10T and within the flexible substrate 10. FIG. 1B illustrates that integrated circuits 15A and 15B have been deposited into the flexible substrate 10. Furthermore, another type of electrical component, an electrode 14, such as a bus electrode or other type of electrode, is also included in the flexible substrate 10. It will be appreciated that electrode 14 as well as integrated circuits 15A and 15B may be any of a variety of different electrical devices, such as display drivers or circuits to provide radio frequency tags, etc. In the case of FIG. 1B, the circuits 15A and 15B are display drivers for the backplane of a display device, such as a liquid crystal display device or an OLED display device.

Laser drilling is used, in one embodiment, to drill a hole or opening through the flexible substrate 10 such that the hole or opening exposes the conductive layer (e.g., the metal backing). Holes 17, 18 and 19 are drilled through the flexible substrate 10 to expose a portion of the conductive layer 11 as shown in FIG. 1C. In one example, the holes or the openings are cut or drilled through the flexible substrate 10 from the top surface 10T to the bottom surface 10B. Then a conductive material or element is applied into these holes to form electrical contacts to the conductive layer 11 and also to form electrical contacts to electrical components on the opposite side of the flexible substrate 10. As shown in FIG. 1D, conductive element 17A makes an electrical contact to a portion of the conductive layer 11 while also making another electrical contact to electrode 14. Similarly, conductive element 18A makes an electrical contact to a portion of the conductive layer 11 and also to an electrical interconnection pad (not shown) on the integrated circuit 15A. Similarly, the conductive element 19A makes an electrical contact to a portion of the conductive layer 11 and also to an electrical interconnection pad (not shown) on the integrated circuit 15B. Examples of a conductive element include metals such as copper, gold, silver, tungsten, aluminum, and any other suitable metal alloys. These examples do not represent an exhaustive list of the conductive element or material.

In one exemplary embodiment, the conductive layer 11 is segmented into at least two segments. In one example, the conductive layer 11 is patterned using conventional methods to create a conductive layer 11 with a plurality of conductors. After segmenting the conductive layer 11 into at least two segments 11A and 11B, the structure shown in FIG. 1E is produced. The conductive layer 11 now comprises a plurality of conductors or electrodes. In this case, the conductive layer 11 has been segmented to produce at least two electrodes 11A and 11B to provide the proper electrical conductivity to portions of the circuits on the opposite face of the flexible substrate 10.

It will be appreciated that FIGS. 1A, 1B, 1C, 1D, and 1E represent a particular example of the present invention and that alternative examples may be envisioned. For example, the flexible substrate 10 may be replaced with another material which can provide similar flexibility for a flexible display. Further, the conductive layer 11 may be replaced with a conductive polymer or other non-metallic material to provide sufficient conductivity for the electrodes which are to be created from the conductive layer 11 and this conductive polymer may also provide dimensional stability. Further, the particular sequence of process operations shown by FIGS. 1A, 1B, 1C, 1D, and 1E may be altered such that certain operations are performed in a different sequence than that shown in FIGS. 1A, 1B, 1C, 1D, and 1E. For example, the backplane fabrication process may be completed after segmenting the metal conductive layer 11.

It will also be appreciated that this discussion applies to electronic devices other than a display (see example below). Thus, the embodiments discussed are not limited to only flexible display.

Figure 2:
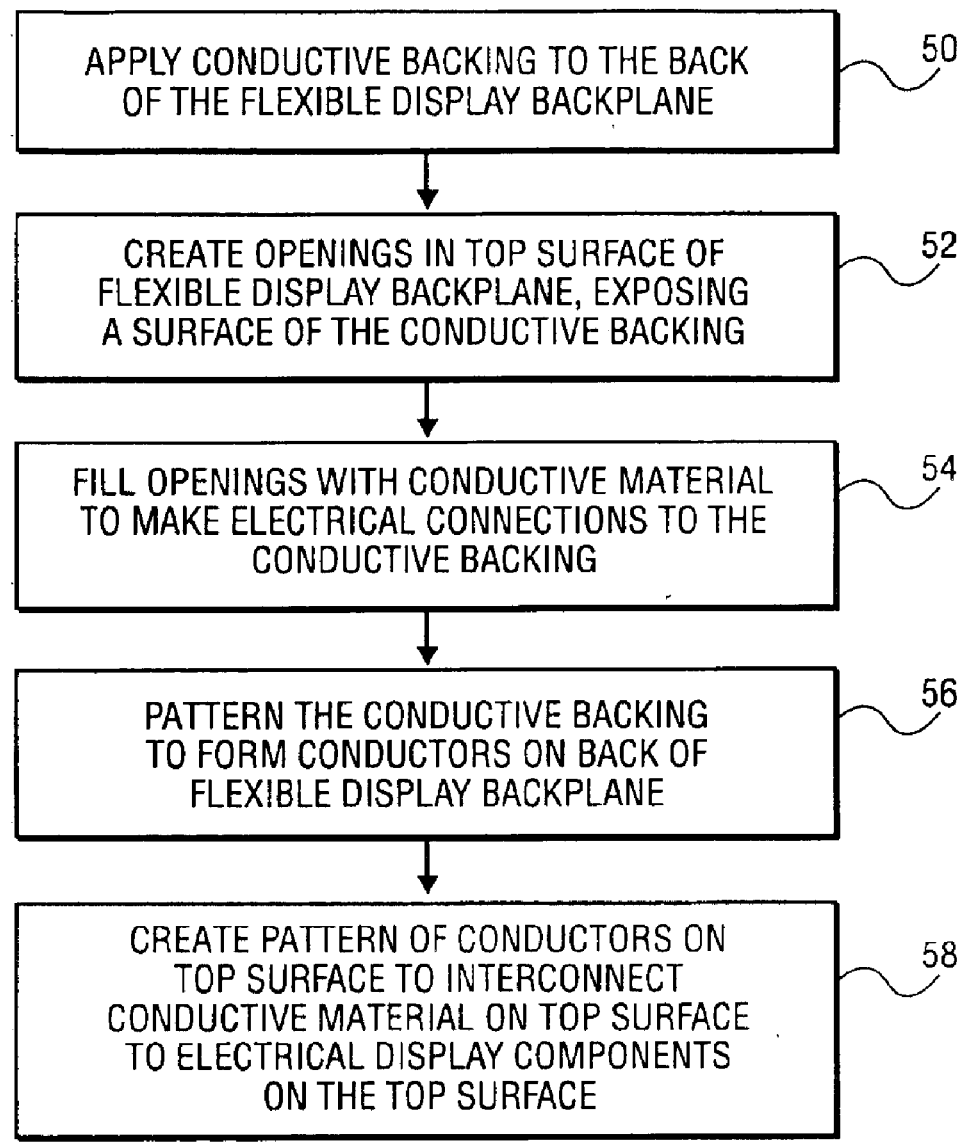
FIG. 2 shows an exemplary method according to one embodiment of the present invention.

FIG. 2 is a flowchart showing an exemplary method of the present invention. In process operation 50, a conductive backing is applied to the back of a flexible display backplane. In many instances, a flexible display substrate such as a plastic material may be commercially obtained with the metal backing already applied to it. The display backplane structure, which includes the electrical components such as display drivers and row and column electrodes, is created on or in the surface of the flexible substrate in order to create a display backplane which is flexible. Then in operation 52, openings are created in the top surface of the flexible display backplane such as the openings 17, 18, and 19 as shown in FIG. 1C. These openings expose a surface of the conductive backing, also as shown in FIG. 1C. Then in operation 54, the openings are filled with a conductive material to make electrical connections to the conducting backing. An example of this conductive material is shown as conductive material 17A, 18A and 19A as shown in FIG. 1D. Then in operation 56, the conductive backing is patterned to form conductors on the back of the flexible display backplane. An example of this patterning is shown in FIG. 1E in which the metal backing has been segmented into two electrodes 11A and 11B. Then in operation 58, a pattern of conductors is created on the top surface to interconnect the conductive material, which is disposed in the openings and on the top surface, to electrical display components on the top surface of the flexible display backplane. An example of these conductors on the top surface is shown in FIG. 1E where the portion of the conductive material on the top surface is electrically coupled to electrical contacts on components such as components 15A and 15B on the top surface of the substrate 10. It will be understood that the method of FIG. 2 is one exemplary method and that alternatives, including alternative sequences, are possible according to the present invention. For example, operations 58 and 56 may be reversed in sequence.

Figure 3:
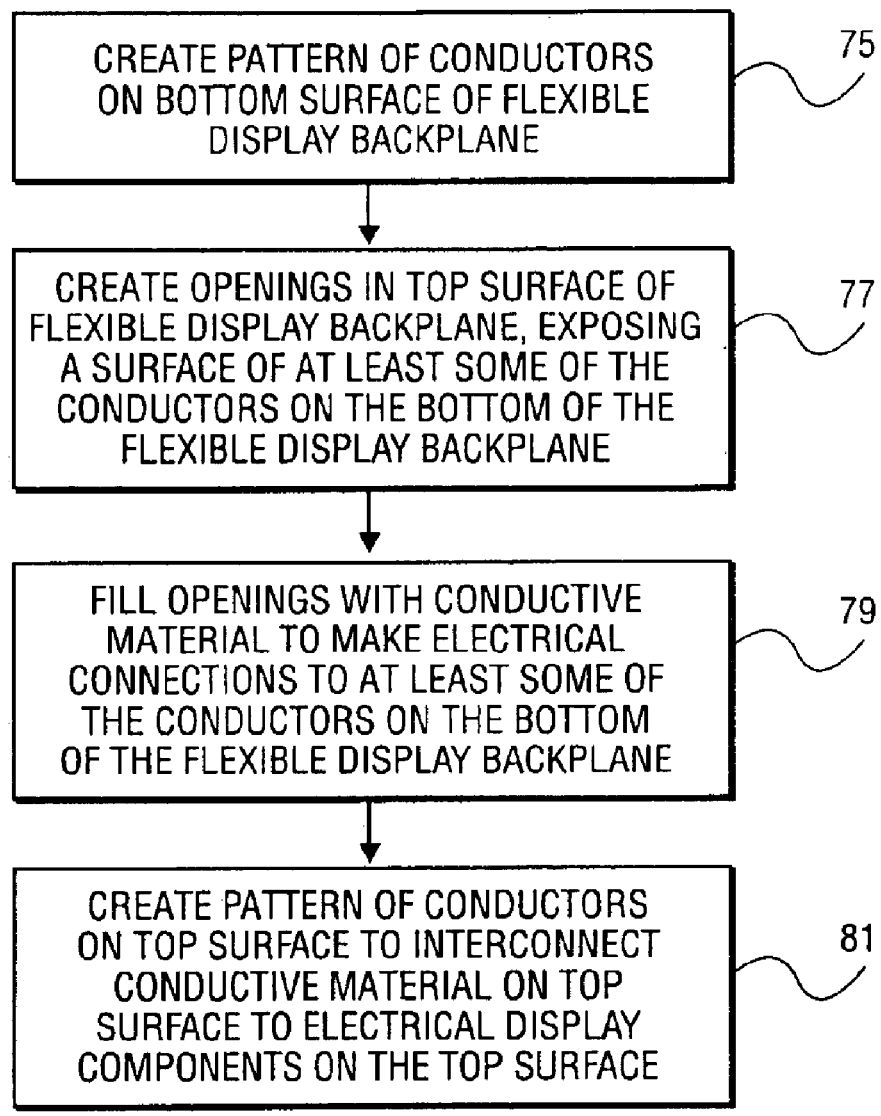
FIG. 3 shows another exemplary method according to an embodiment of the present invention.

FIG. 3 illustrates another exemplary embodiment of the present invention. Operation 75 of this method creates a pattern of conductors on the bottom surface of a flexible display backplane. In this instance, a metal backing such as the metal backing 11, is patterned to create a plurality of conductors on the bottom surface before openings are created in operation 77. These openings expose a surface of at least some of the conductors on the bottom of the flexible backplane. Then in operation 79, the openings are filled with conductive material to make electrical connections to at least some of the conductors on the bottom of the flexible display backplane. Then in operation 81, a pattern of conductors on the top surface is created to interconnect the conductive material in the openings to various electrical display components on the top surface of the flexible display backplane. Again, various alternative sequences of the method shown in FIG. 3 will be envisioned by those in the art.

FIGS. 4A, 4B, 4C, 4D and 4E will now be referred to while describing an embodiment of the invention in which a passive matrix display is created with backside electrode contacts on a flexible display substrate. In one example, a metal backed flexible plastic substrate 101 is the starting material which is shown in FIG. 4A. Column and row driver circuitry is created in the top surface of this substrate. One manner of creating this circuitry is to fabricate in semiconductor wafers various column and row drivers and then to separate these drivers from the wafers and deposit each individual integrated circuit as a block into a receptor region of the substrate 101. The process for deposition may include the use of fluidic self-assembly to deposit the blocks into the receptor regions. The example shown in FIG. 4B shows three row drivers 103A, 103B, and 103C deposited into the substrate 101 and three column drivers 102A, 102B, and 102C also deposited onto the substrate 101. A set of column conductors 104 may typically be formed on the top surface of the substrate 101 and another set of conductors, the row conductors 105, will be formed on a separate substrate such as a cover substrate or a flexible cover substrate. Thus it will be appreciated that FIGS. 4B, 4C, 4D, and 4E include a set of conductors, the row conductors 105, which exist on a separate substrate but are shown in these figures nevertheless. It will be appreciated that the row drivers will be coupled to the row electrodes through conventional techniques for forming a vertical interconnection from a first substrate, such as the substrate 101, to a cover substrate. It may be noted that this example pertains more to a liquid crystal type of a display cell in which a liquid crystal compound is injected or sandwiched between the substrate 101 having the column conductors 104 and the other substrate having the row conductors 105. The row conductor drivers and the column conductor drivers can both be on the same substrate or each be on the corresponding substrate of the rows and column conductors that each controls.

The process creating the display cell may be modified accordingly for other type of display. For example, for an OLED or PLED, a sequential process is used to create the display cell. A substrate is first provided then conventional methods are used to deposit a layer of ITO, which is anode, on the substrate. The ITO is then patterned to form the column conductors much like the column conductors 104 discussed above. A display medium such as an OLED stack (having a hole transport layer, an electroluminescent material, and an electron transport layer) is then deposited on the ITO layer. The OLED stack can be replaced with a PLED stack or other suitable display material to maker other type of display. Next, a cathode layer is deposited and patterned to form row conductors much like the row conductors 105. A cover substrate (flexible or not) is deposited over the cathode layer completing the display cell.

As shown in FIG. 4C, through holes are patterned into the plastic substrate so that row and column electrodes can be created on the backside of the substrate. As shown in FIG. 4C, through holes 107A, 107B and 107C are formed to make backside connections for the column drivers 102A, 102B, and 102C. Similarly, through holes 108A, 108B, and 108C are formed in the substrate 101 in order to make electrical connections from the backside to the row drivers 103A, 103B, and 103C. Subsequently, the through holes are filled with a conductive material to establish electrical connections to the metal backing as shown in FIG. 4D. In particular, conductive material 110A, 110B, and 110C fill through holes 107A, 107B, and 107C. Similarly, conductive material 109A, 109B and 109C fill the through holes 108A, 108B, and 108C. Then, as shown in FIG. 4E, the metal backing is patterned into discrete electrodes to create electrodes 111 and 112. This patterning may be done before or after the creation of the through holes. It will be appreciated that the particular discrete electrodes used to create electrical connections on the backside to the drivers on the top side depend upon the particular circuit or display being fabricated. The particular pattern shown in FIG. 4E is a simplistic representation of two separate electrodes, and it will be appreciated that various other types of electrode patterns may be created as required by the electrical circuit which the display device requires.

FIG. 5 shows a cross-sectional view of a smart card 200, which includes a display device or module 211 fabricated with backside electrodes 201 according to one embodiment of the present invention. In this case, a display medium 220 is sandwiched between a counter electrode 202 and the driver electronics 204 on the plastic substrate 206 through which through holes 210 have been created. The plastic substrate 206 forms the display module for the smart card in this embodiment. The display module 211 is deposited into an opening 208 in the flexible smart card 200 as shown in FIG. 5.

As noted above, a preferred embodiment of the present invention uses laser drilling to create openings in the substrate 206 for the through holes 210 to make electrical connections from the backside 212 of the substrate 206 to the top surface 214 of the substrate 206. The backside electrodes 201 make contact to smart card contact pads 216 included with the smart card 200. The smart card contact pads 216 enable the display device to interconnect to a master controller (not shown) typically present in a smart card. The master controller controls the information that will be displayed in the display device.

Various different types of lasers may be employed to make these through holes mentioned in this discussion. The wavelength of these lasers may vary from ultraviolet to infrared. For plastic substrates, a transverse excitation atmospheric pressure pulsed $CO_2$ laser can be used. The holes typically in this embodiment will be tapered. In one embodiment, a YAG laser from ESI (Laser Microvia Drill, model no. 5200) may be employed. Alternatively, an excimer laser may be employed. In the case of the YAG laser, the frequency may be doubled, tripled, or quadrupled to provide a near ultraviolet wavelength.

What is claimed is:

1. A flexible display device comprising:
   a flexible substrate having a top surface and a bottom surface, said top surface comprising electrical display components, said flexible substrate comprising openings cutting therethrough from said top surface to said bottom surface;
   a conductive layer coupling to said bottom surface wherein said openings expose at least a portion of said conductive layer; and
   conductive elements filling said openings to make first electrical contacts to at least a portion of said conductive layer and second electrical contacts to said electrical display components on said flexible substrate;
   wherein said conductive layer constitutes at least 10% of a thickness of said flexible substrate.

2. A flexible display device comprising:
   a flexible substrate comprising electrical display components, said flexible substrate having a top surface, said top surface having openings cutting therethrough;
   a conductive layer disposed below said top surface wherein said openings exposing at least a portion of said conductive layer; and
   conductive elements filling said openings to make first electrical contacts to at least a portion of said conductive layer and second electrical contacts to said electrical display components on said flexible substrate
   wherein said conductive layer constitutes at least 10% of a thickness of said flexible substrate.

3. A flexible Radio Frequency Identification (RF ID) device comprising:
   a flexible substrate having a top surface and a bottom surface, said top surface comprising electrical RF ID components, said flexible substrate comprising openings cutting therethrough from said top surface to said bottom surface;
   a conductive layer coupling to said bottom surface wherein said openings expose at least a portion of said conductive layer; and
   conductive elements filling said openings to make first electrical contacts to at least a portion of said conductive layer and second electrical contacts to said electrical RF ID components on said flexible substrate
   wherein said conductive region is patterned to form a plurality of conductors from said conductive layer; and
   wherein each of said openings is electrically coupled to at least one of said plurality of conductors;
   wherein said electrical RF ID components comprise at least one integrated circuit. fabricated in a first rigid substrate and deposited onto a region of said flexible substrate;
   wherein said conductive layer constitutes at least 10% of a thickness of said flexible substrate.

4. A flexible Radio Frequency Identification (RE ID) device comprising:
   a flexible substrate comprising electrical RF ID components said flexible substrate having a top, surface, said top surface having openings cutting therethrough;
   a conductive layer disposed below said top surface wherein said openings exposing at least a portion of said conductive layer; and
   conductive elements filling said openings to make first electrical contacts to at least a portion of said conductive layer and second electrical contacts to said electrical RF ID components on said flexible substrate.
   wherein said conductive layer constitutes at least 10% of a thickness of said flexible substrate.

5. A flexible electronic device comprising:
   a flexible substrate having a top surface and a bottom surface, said top surface comprising electrical components, said flexible substrate comprising openings cutting therethrough from said top surface to said bottom surface;
   said bottom surface comprising a conductive region wherein said openings exposing at least a portion of said conductive region; and
   conductive elements filling said openings to make first electrical contacts to at least a portion of said conductive region and second electrical contacts to said electrical components on said flexible substrate;
   wherein said conductive region is patterned to form a plurality of conductors from said conductive region; and wherein each of said openings is electrically coupled to at least one of said plurality of conductors;
   wherein said electrical components comprise at least one passive electronic component and at least one integrated circuit, fabricated in a first rigid substrate and deposited onto a region of said flexible substrate.

6. A flexible electronic device comprising:
   a flexible substrate having a top surface and a bottom surface, said top surface comprising electrical components, said flexible substrate comprising openings cutting therethrough from said top surface to said bottom surface;
   said bottom surface comprising a conductive region wherein said openings exposing at least a portion of said conductive region; and
   conductive elements filling said openings to make first electrical contacts to at least a portion of said conductive region and second electrical contacts to said electrical components on said flexible substrate;
   wherein said conductive region constitutes at least 10% of a thickness of said flexible substrate.

7. A flexible electronic device comprising:
   a flexible substrate comprising electrical components, said flexible substrate having a top surface, said ton surface having openings cutting therethrough;
   a conductive layer disposed below said top surface wherein said openings exposing at least a portion of said conductive layer; and
   conductive elements filling said openings to make first electrical contacts to at least a portion of said conductive layer and second electrical contacts to said electrical components on said flexible substrate;
   wherein said electrical components comprise at least one passive electronic component and at least one integrated circuit, fabricated in a first rigid substrate and deposited onto a region of said flexible substrate.

8. A flexible electronic device comprising:
a flexible substrate comprising electrical components, said flexible substrate having a top surface, said top surface having openings cutting therethrough;
a conductive layer disposed below said top surface wherein said openings exposing at least a portion of said conductive layer; and
conductive elements filling said openings to make first electrical contacts to at least a portion of said conductive layer and second electrical contacts to said electrical components on said flexible substrate;
wherein said conductive layer constitutes at least 10% of a thickness of said flexible substrate.

* * * * *

UNITED STATES PATENT AND TRADEMARK OFFICE
CERTIFICATE OF CORRECTION

PATENT NO. : 6,864,435 B2 Page 1 of 1
APPLICATION NO. : 10/131517
DATED : March 8, 2005
INVENTOR(S) : Hermanns et al.

It is certified that error appears in the above-identified patent and that said Letters Patent is hereby corrected as shown below:

Col. 7, Line 63, please delete "circuit." and insert -- circuit, --.

Col. 8, Line 1, please delete "RE ID" and insert -- RF ID --.

Col. 8, Line 4, please delete "top, surface" and insert -- top surface --.

Col. 8, Line 55, please delete "ton" and insert -- top --.

Signed and Sealed this

Twentieth Day of February, 2007

JON W. DUDAS
*Director of the United States Patent and Trademark Office*